United States Patent
Ho

(10) Patent No.: US 7,161,375 B2
(45) Date of Patent: Jan. 9, 2007

(54) PHASE-LOSS DETECTION FOR ROTATING FIELD MACHINE

(75) Inventor: Eddy Ying Yin Ho, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 71 days.

(21) Appl. No.: 11/063,450

(22) Filed: Feb. 23, 2005

(65) Prior Publication Data

US 2006/0186914 A1    Aug. 24, 2006

(51) Int. Cl.
  *G01R 31/00*   (2006.01)
(52) U.S. Cl. .................................... 324/772
(58) Field of Classification Search .................. None
  See application file for complete search history.

(56) References Cited

U.S. PATENT DOCUMENTS

| | | | | |
|---|---|---|---|---|
| 4,354,216 A | * | 10/1982 | Volta | 361/92 |
| 4,544,982 A | * | 10/1985 | Boothman et al. | 361/96 |
| 4,710,692 A | * | 12/1987 | Libert et al. | 318/729 |
| 4,796,142 A | * | 1/1989 | Libert | 361/23 |
| 4,912,390 A | * | 3/1990 | Curran et al. | 318/812 |

\* cited by examiner

*Primary Examiner*—Jermele Hollington
(74) *Attorney, Agent, or Firm*—Ostrolenk, Faber, Gerb & Soffen, LLP

(57) ABSTRACT

A method for detecting a loss of a phase in a multiphase rotating field machine, the method comprising providing a first electrical current into the machine windings to cause the current vector to assume a first current vector position, sensing a first current in at least one selected phase winding of the machine, comparing the sensed first current in the at least one selected phase winding with a first calculated current for the selected phase winding, and detecting that a first phase fault has occurred if the first calculated and sensed first currents differ by more than a predetermined value.

20 Claims, 2 Drawing Sheets

PHASE-LOSS DETECTION FOR ROTATING FIELD MACHINE

BACKGROUND OF THE INVENTION

1. Field of the Invention

The present invention relates to fault detection in rotating field machines, including permanent magnet motor and induction motor drive systems, and relates more particularly to detection of phase loss in a rotating field machine.

2. Description of Related Art

Permanent magnet (PM) and induction motors and motor drive systems are known for use in a variety of applications involving motion and velocity control. Some types of motor drives include a power inverter that selectively delivers power to various phases in a multiphase motor. One type of motor uses three phases that are each excited according to a particular methodology to interact with a permanent magnet to drive the motor according to a desired profile. Due to design and other practical considerations, connections to the motor from the power inverter are often made with cables or wiring connections that may vary in length, such that the power inverter is separated from the motor. Precautions are typically taken to protect the cables and wiring connections from the impact of EMI and other noise signals that are often found in motor drive systems.

Despite the additional precautions usually taken in protecting the cables and wiring connections between the power inverter and the motor, problems with respect to the cables or wiring connections can sometimes occur. For example, drive operation failure occurs when wiring connections between drive and motor are broken, loose or misconnected. For example, any of the above problems may lead to motor startup failure.

In cases where a large starting torque is not required, the motor may start and continue to run, but with significant torque ripple. The torque ripple substantially reduces drive efficiency, increases audible noise and eventually may damage the connecting shaft load. It would be desirable to detect when a faulty motor electrical connection exists, and provide a failure response in that case.

SUMMARY OF THE INVENTION

In accordance with the present invention there is provided a system and method for detecting the loss of a phase in a rotating field machine such as a permanent magnet synchronous motor with a sensorless feedback detection system or an induction motor. Permanent magnet synchronous motors (PMSMs) may be initialized upon startup by being parked at a certain angle to obtain an initial condition for starting and running the motor. A technique for parking the motor involves forcing DC current through the motor windings to cause the motor shaft to park at a certain prescribed angle. Parking may be accomplished in several stages where a current vector in a synchronous rotating frame current regulator is aligned with a first phase and then another phase, during which alignments the currents of other phases may be measured. When the current of phases that are not aligned to the current vector are measured, they fall within expected ranges, or else an error is observed. When particular current amplitudes fall outside of anticipated ranges, a phase loss error is indicated.

Accordingly, the present invention describes a method of detecting rotating field machine phase disconnection or phase errors between a rotating field machine drive and a rotating field machine during startup of the rotating field machine. Phase loss can be determined by monitoring only one phase current feedback derived from a 2-stage DC current injection during the startup of a permanent magnet motor drive.

The Phase-Loss detection scheme of the invention can be incorporated into the start-up sequence of a motor without extending startup duration. Advantageously, the startup sequence of the motor can be stopped to prevent mechanical damage to the system driven by the motor, based on the results of the phase loss detection.

Other features and advantages of the present invention will become apparent from the following description of the invention which refers to the accompanying drawings.

DETAILED DESCRIPTION OF THE PREFERRED EMBODIMENTS

Figure 1:
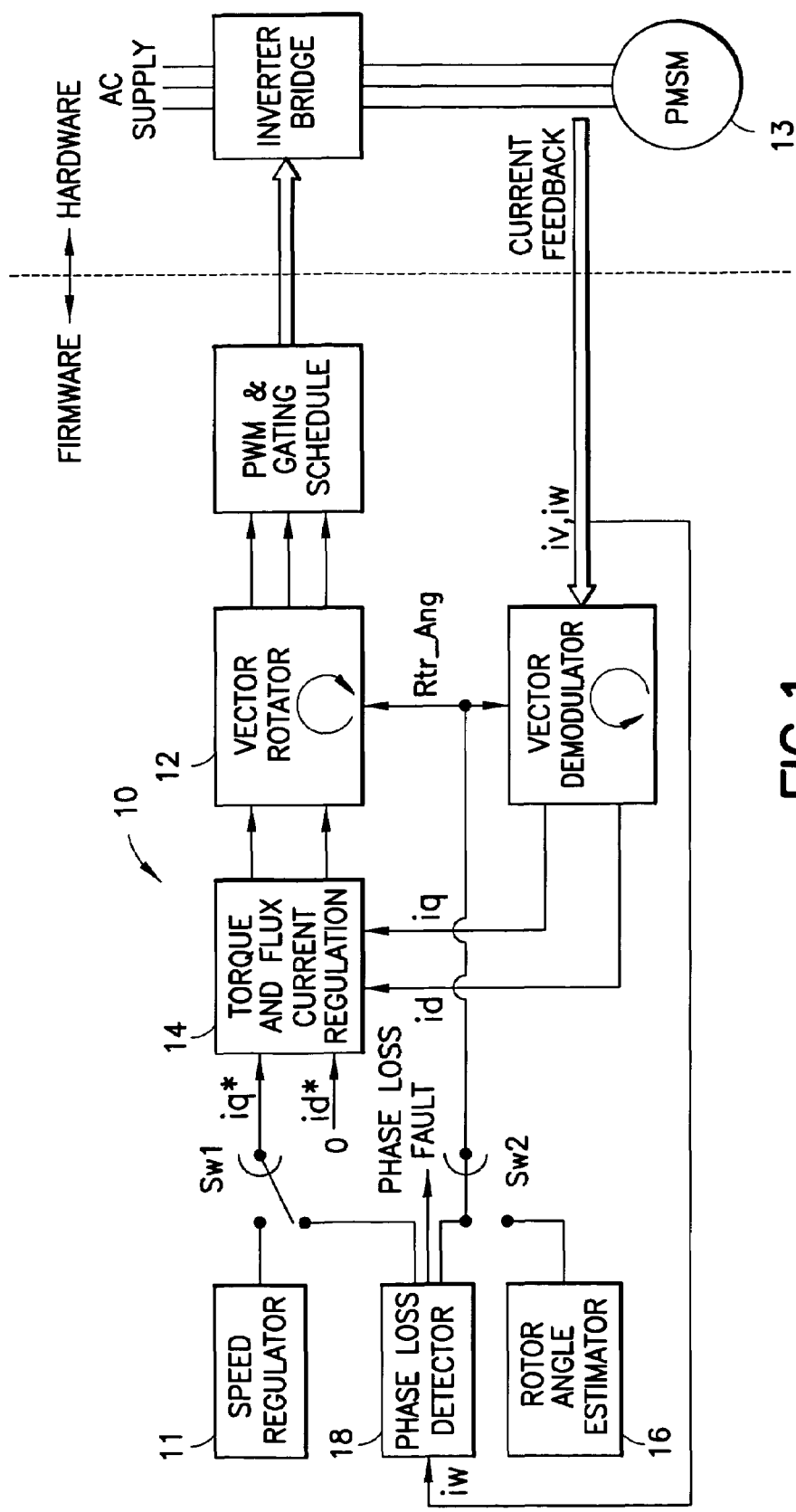
FIG. 1 is a system block diagram of a PMSM control with rotor angle estimation.

The present invention relates to a phase loss detection system and algorithm that is preferably implemented in firmware. Referring now to FIG. 1, a motor control system with a phase loss detection block 18 according to the present invention is shown generally as a system 10. System 10 is PMSM drive system with a synchronous rotating frame current regulator. The system can also drive another type of rotating field machine, such as an induction motor. A vector rotator control 12 is provided with torque and flux current regulation parameters from a regulator 14, and is also provided with a rotating angle reference Rtr-Ang from a rotor angle estimator 16. The rotating angle reference supplied to control 12 is connected through a switch SW2 to estimator 16. During startup, however, switch SW2 is connected to a phase loss detector 18 according to the invention to perform a phase loss detection operation, where detector 18 supplies the rotator angle signal to vector rotator 12. In addition, detector 18 also supplies a torque current command iq* to regulator 14 during startup through a switch SW1. During normal operation, that is, after startup, switch SW1 connects speed regulator 11 to regulator 14 to permit speed regulator 11 to supply torque current command iq*.

Detector 18 receives current feedback from a phase of PMSM 13 to detect whether a phase has been lost. In the exemplary embodiment illustrated in FIG. 1, a current feedback signal for phase W is supplied as a signal iW to detector 18. If detector 18 determines a phase has been lost, a phase loss fault is annunciated to indicate the event.

Operation of phase loss detector 18 is derived from the principle that PMSM 13 is initially parked upon motor startup for the determination of an initial rotor angle. During the startup of a sensorless permanent magnet motor, the initial rotor angle is identified by forcing DC current into the motor and thereby forcing the motor shaft to park at a certain prescribed angle. The parking operation typically occurs in two stages to identify the initial rotor shaft angle.

Figure 2:
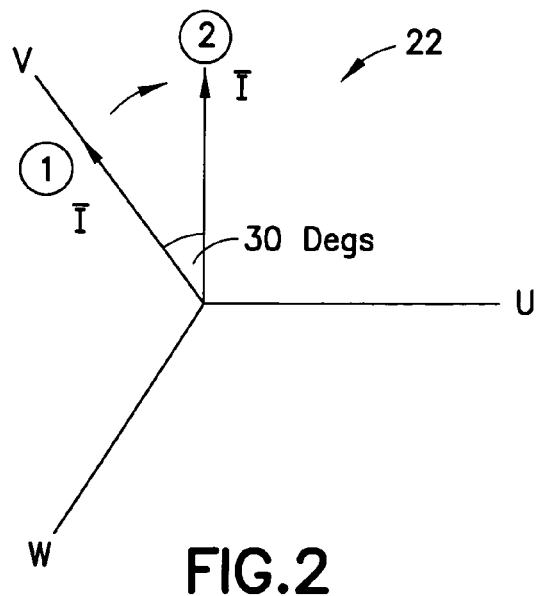
FIG. 2 is a current vector diagram.

Referring now to FIG. 2, a vector diagram 22 illustrates current being forced into PMSM 13 in two stages, where the vectors are illustratively separated by a 30° angle. In a first stage of parking, a current vector $\bar{I}$ is forced to align through the use of current regulators with a V-phase for a certain period of time. This first stage is illustrated in FIG. 2 as a vector on the V-axis during a step No. 1. When current vector Ī is so forced, the currents in the U and the W-phases are equal to half of the current magnitude I in the V-phase. The current magnitude I is equal to iq* supplied to regulator 14.

In a second stage of parking, a current vector angle Rtr_Ang (see FIG. 1) is changed such that current vector Ī is forced through the use of current regulators to align orthogonal to the U-phase. This second stage is represented by current vector Ī labeled No. 2 in FIG. 2. In this second stage the current in the U-phase is zero and the current in the V and W-phases are equal and opposite with amplitudes, for example, of approximately 0.8666 times that of current magnitude I. By comparing the feedback current, phase W in this exemplary embodiment, with an anticipated current amplitude (−0.5*I in stage 1, −0.8666*I in stage 2), phase loss can be detected. That is, if the expected current does not match the measured current during these operations, a lose of phase is indicated. A range of values for expected currents may be provided to obtain a threshold window in which the measured current is considered valid, in which no phase loss is indicated. The range of expected current values or thresholds may be made variable or may be set to depend upon the application parameters as desired.

The comparison between expected and measured current values is done at the end portion of each of the parking stages to allow sufficient settling time for current control. If the comparison does not fall within a certain current band, phase loss will be announced. When a phase loss is indicated, motor drive system 10 can react in a number of ways, including operating in a failsafe mode, operating in a low functionality state, disabling the motor and so forth. It is contemplated that a restart mechanism may be employed to attempt to restart the motor if a phase loss is initially detected. For example, motor drive system 10 may be programmed to reinitialize the motor drive system in the parking stage after a phase loss detection error is produced.

After parking stages 1 and 2 are completed without error, normal operation resumes. Switch SW1 is placed in the upper position to permit speed regulator 11 to supply torque current command iq* and switch SW2 is placed in the lower position to permit estimator 16 to generate estimated rotor angle Rtr_Ang.

Figure 3:
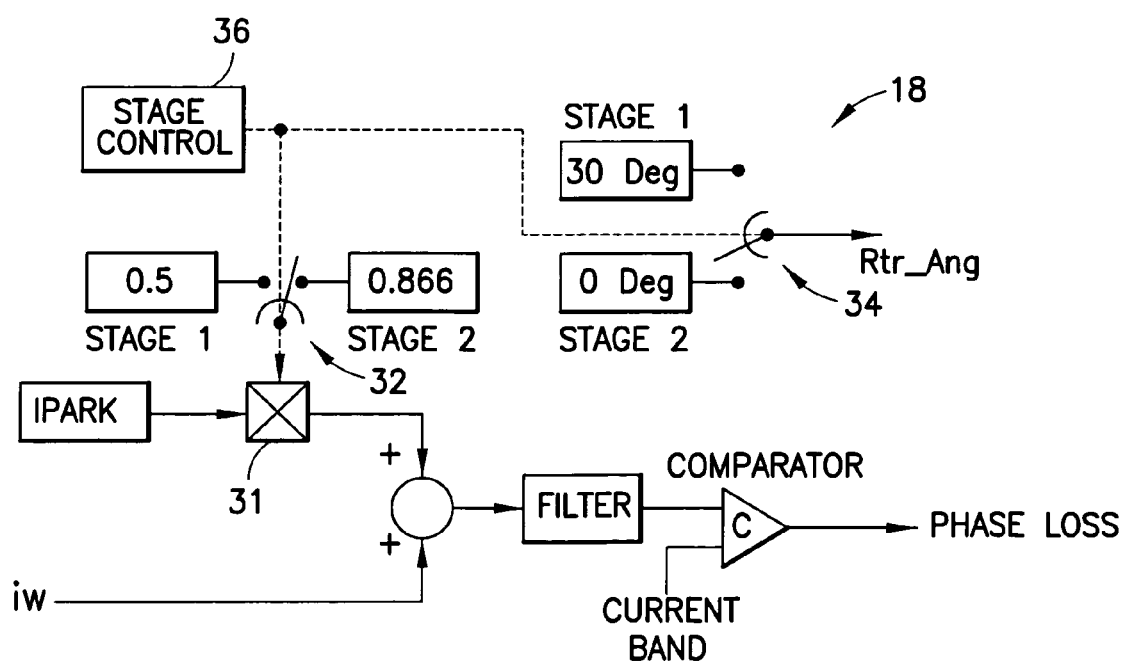
FIG. 3 is a system block diagram of a phase loss detector according to the present invention.

Referring now to FIG. 3, a system block diagram of detector 18 is illustrated. A current parameter Ipark is shown as an input to a multiplier 31 that forms a portion of the calculation for the phase loss detection algorithm that is supplied with a multiplier, for example, of either 0.5 for stage 1 or 0.866 for stage 2, depending upon the state of a switch 32 and the parking angle. Other values will be used depending on the state of switch 32 and the parking angle. Current parameter Ipark is delivered to switch SW1 illustrated in FIG. 1 to supply the torque current command to regulator 14. Accordingly, the magnitude provided by current parameter Ipark is the magnitude supplied for torque current command iq* during the parking stage.

A stage control 36 provides a switching logic to switch switches 32 and 34 to supply the appropriate parameters to multiplication block 31 and estimated rotor angle Rtr_Ang. During stage 1, in the example, current parameter Ipark is multiplied by 0.5, and the result is added to current feedback iW. As discussed, the multiplier depends on the state of switch 32 and the parking angle. The result of the addition is filtered and applied to a comparator to determine if the motor current is out of range, indicating a phase loss. Also during stage 1, estimated rotor angle Rtr_Ang is set to 30° with respect to the V-phase to obtain the desired current feedback iW. The feedback current iW obtained as a result of the settings for current parameter Ipark and torque current command iq* permits an appropriate range for the signal supplied to comparator C. The phase loss detection according to detector 18 occurs serially, so that a fault may be detected in either of stages 1 or 2. After stage 1 is complete, stage control 36 operates switches 32, 34 to apply the appropriate parameters to motor drive system 10 to determine phase loss detection in stage 2. Accordingly, in the example, a value of 0.8666 is applied to multiplier 31 in combination with current parameter I park, which is then compared against current feedback IW, the result of which is passed through a filter and applied to comparator C to determine whether a phase loss has occurred with respect to the current band thresholds also applied to comparator C. The multiplier depends on the state of switch 32 and the parking angle. During stage 2, switch 34 is operated to apply a 0° angle to the current vector with respect to V-phase, so that the current vector is orthogonal to U-phase. A phase loss detection is thus completed separately for stage 2 to provide a separate phase loss indication from stage 1. If a phase loss fault is indicated in either stage 1 or stage 2, the result is announced by the phase loss detection signal.

A number of variations of the phase loss detector according to the present invention are contemplated to be within the scope of the present invention. Some non-limiting examples include providing a programmable or adaptive phase loss detector with variable parameters that may be modified in accordance with the desired motor drive system parameters. Moreover, several comparators may be used in the phase loss detector rather than the single comparator C illustrated in FIG. 3. Other phases may be used to achieve the phase loss detection aside from W-phase as well.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A method for detecting a loss of a phase in a multiphase rotating field machine, the method comprising:
switching a controller for the machine into a start-up mode prior to providing an electrical current into the machine windings;
providing a first electrical current into the machine windings to cause the current vector to assume a first current vector position;
sensing a first current in at least one selected phase winding of the machine;
comparing the sensed first current in the at least one selected phase winding with a first calculated current for the selected phase winding; and
detecting that a first phase fault has occurred if the first calculated and sensed first currents differ by more than a predetermined value.

2. The method of claim 1, further comprising:
providing a second electrical current into the machine windings to cause the current vector to assume a second current vector position;
sensing a second current in at least one selected phase winding of the machine;
comparing the sensed second current in the at least one selected phase winding with a second calculated current for the selected phase winding; and detecting that a second phase fault has occurred if the second calculated and sensed second currents differ by more than a predetermined value.

3. The method of claim 1, further comprising generating a phase fault signal if either the first or second phase faults has been detected.

4. The method of claim 3, further comprising switching the controller to normal operation if no phase fault signal is generated.

5. The method of claim 1, wherein the step of comparing comprises:
providing a current parameter that is used to determine a current command to the machine;
multiplying the current parameter by a value; and
comparing a product of the step of multiplying with the sensed first current to determine if the sensed first current differs from the product by more than the predetermined value.

6. The method of claim 1, wherein the second step of comparing comprises:
providing a current parameter that is used to determine a current command to the machine;
multiplying the current parameter by a value; and
comparing a product of the step of multiplying with the sensed second current to determine if the sensed second current differs from the product by more than the predetermined value.

7. The method of claim 1, further comprising providing the output of a speed regulator to the controller to control machine operation if no phase fault signal is generated.

8. The method of claim 7, further comprising providing an estimate of the machine rotor angle to the controller if no phase fault signal is generated.

9. A system for detecting a loss of a phase in a multiphase rotating field machine, the system comprising:
a controller coupled to the machine;
a switch switching the controller for the machine into a start-up mode prior to providing an electrical current into the machine winding;
a device for providing a first electrical current into the machine windings to cause the current vector to assume a first current vector position;
a sensor for sensing a first current in at least one selected phase winding of the machine;
a comparator for comparing the sensed first current in the at least one selected phase winding with a first calculated current for the selected phase winding; and
a detector for detecting a first phase fault if the first calculated and sensed first currents differ by more than a predetermined value.

10. The system of claim 9, further wherein:
the device provides a second electrical current into the machine windings to cause the current vector to assume a second current vector position;
the sensor senses a second current in at least one selected phase winding of the machine;
the comparator compares the sensed second current in the at least one selected phase winding with a second calculated current for the selected phase winding; and
the detector detects a second phase fault if the second calculated and sensed second currents differ by more than a predetermined value.

11. The system of claim 9, further wherein the detector generates a phase fault signal if either the first or second phase faults has been detected.

12. The system of claim 9, further comprising a switch for switching the controller to normal operation if no phase fault signal is generated.

13. The system of claim 9, wherein:
the comparator receives a first current parameter that is used to determine a torque current command to the machine;
further comprising a multiplier for multiplying the current parameter by a value; and wherein
the comparator compares a product of the multiplier with the sensed first current to determine if the sensed first current differs from the product by more than the predetermined value.

14. The system of claim 9, wherein the comparator receives a second current parameter that is used to determine a torque current command to the machine;
further wherein the multiplier multiplies the second current parameter by a value; and
further wherein the comparator compares a product of the multiplier with the sensed second current to determine if the sensed second current differs from the product by more than the predetermined value.

15. The system of claim 9, further comprising a speed regulator providing an output to the controller to control machine operation if no phase fault signal is generated.

16. The system of claim 15, further comprising a rotor angle estimator for estimating the rotor angle of the machine, the rotor angle estimator providing an output to a switch which provides the rotor angle estimate to the controller after machine start-up and if no phase fault signal is generated.

17. The system of claim 16, wherein the device for providing the first and second electrical currents into the machine windings provides respective rotor angle signals during start-up to cause the current vectors to assume the respective first and second current vector positions.

18. The system of claim 17, wherein the switch switches from a first position during start-up wherein the rotor angle estimate is provided by the device to a second position whereby the rotor angle estimate is provided by the rotor angle estimator.

19. The system of claim 16, wherein the controller comprises a speed regulator having an output coupled to a torque and flux current regulator, the torque and flux current regulator having an output coupled to a vector rotator having an output coupled to a PWM gating stage, the PWM gating stage having an output coupled to an inverter driving the machine, and wherein feedback signals are provided from the output of the inverter to a vector demodulator, the vector demodulator having an output providing an input to the torque and flux current regulator, further wherein the rotor angle estimator provides the rotor angle estimate to the vector rotator and to the vector demodulator.

20. The system of claim 9, wherein the machine comprises a permanent magnet synchronous motor or an induction motor.

* * * * *